(12) United States Patent
McDevitt et al.

(10) Patent No.: US 7,223,684 B2
(45) Date of Patent: May 29, 2007

(54) DUAL DAMASCENE WIRING AND METHOD

(75) Inventors: Thomas L. McDevitt, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 10/710,478

(22) Filed: Jul. 14, 2004

(65) Prior Publication Data

US 2006/0012052 A1    Jan. 19, 2006

(51) Int. Cl.
*H01L 21/4763* (2006.01)
*H01L 21/20* (2006.01)

(52) U.S. Cl. .............. 438/618; 438/584; 257/E21.577

(58) Field of Classification Search ........ 438/634, 438/633, 627, 672, 687, 618, 584, 597; 257/E21.577
See application file for complete search history.

(56) References Cited

U.S. PATENT DOCUMENTS 5,635,423 A * 6/1997 Huang et al. .............. 438/638
6,133,144 A * 10/2000 Tsai et al. .................. 438/634
6,429,119 B1 * 8/2002 Chao et al. ................ 438/633
6,566,242 B1 * 5/2003 Adams et al. .............. 438/622
6,579,795 B1    6/2003 Hau-Riege
6,611,060 B1    8/2003 Toyoda et al.
2003/0139034 A1    7/2003 Yuang

FOREIGN PATENT DOCUMENTS

EP    1154467    11/2001

OTHER PUBLICATIONS

R. F. Schnabel et al., Slotted Vias for Dual Damascene Interconnects in 1Gb DRAMs, 1999 Symposium on VLSI Technology Digest of Technical Papers, pp. 43-44.

* cited by examiner

*Primary Examiner*—Scott B. Geyer
*Assistant Examiner*—Elias Ullah
(74) *Attorney, Agent, or Firm*—Schmeiser, Olsen & Watts; William D. Sabo

(57) ABSTRACT

A structure and method of fabricating a dual damascene interconnect structure, the structure including a dual damascene wire in a dielectric layer, the dual damascene wires extending a distance into the dielectric layer less than the thickness of the dielectric layer and dual damascene via bars integral with and extending from bottom surfaces of the dual damascene wires to a bottom surface of the dielectric layer.

20 Claims, 7 Drawing Sheets

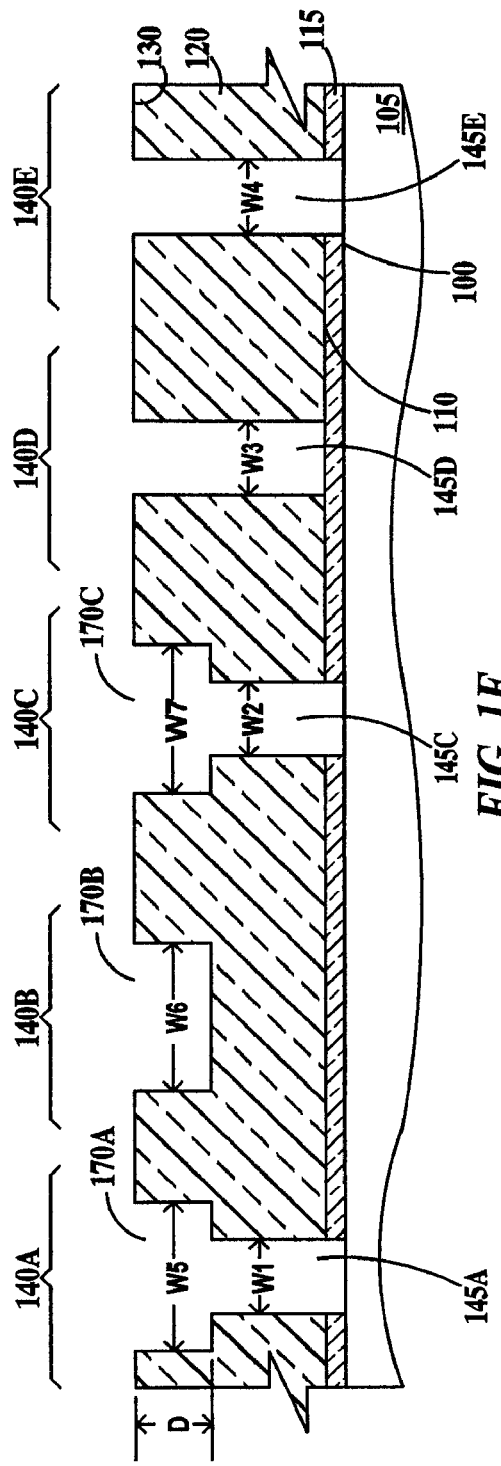
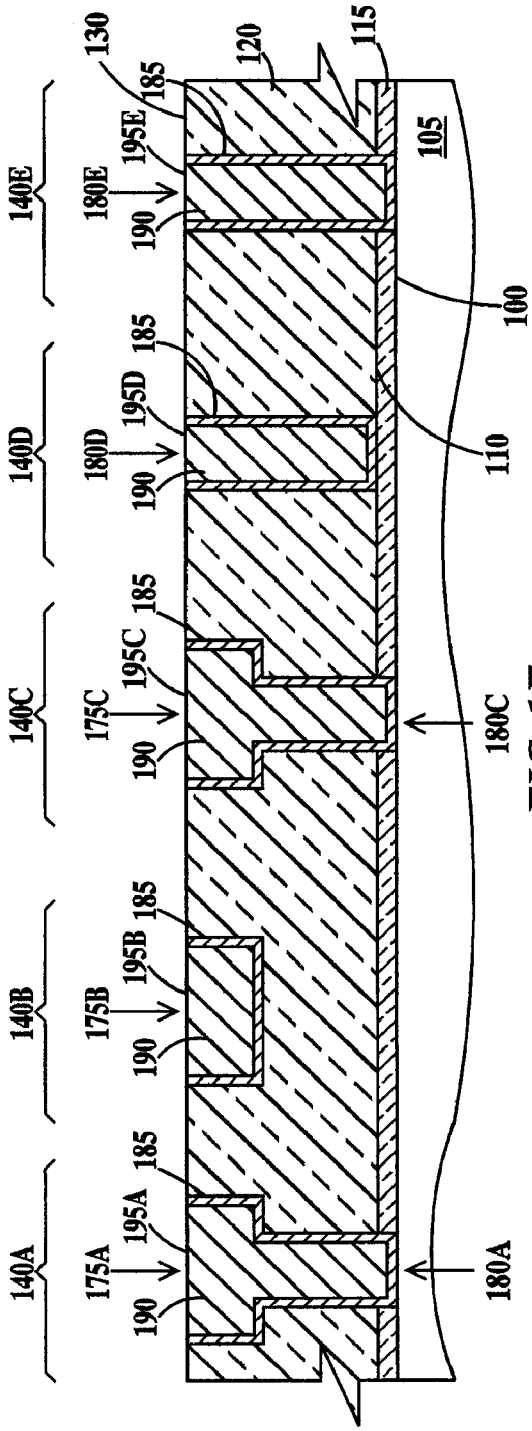
FIG. 1E
FIG. 1F

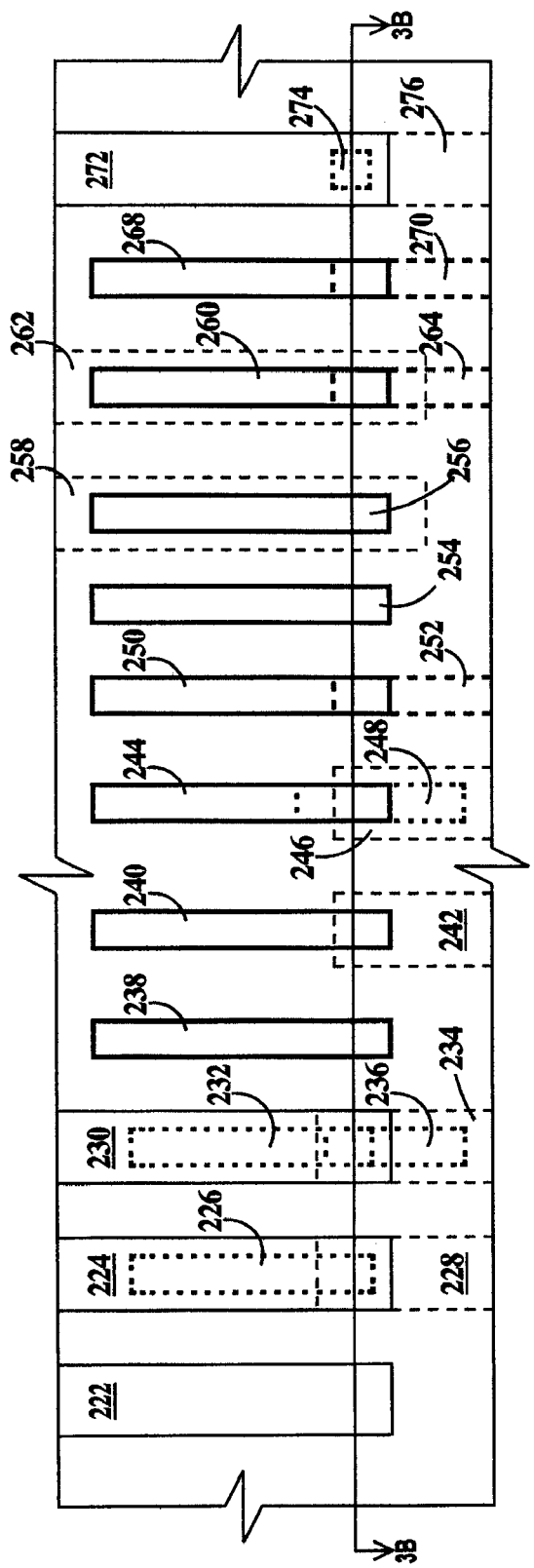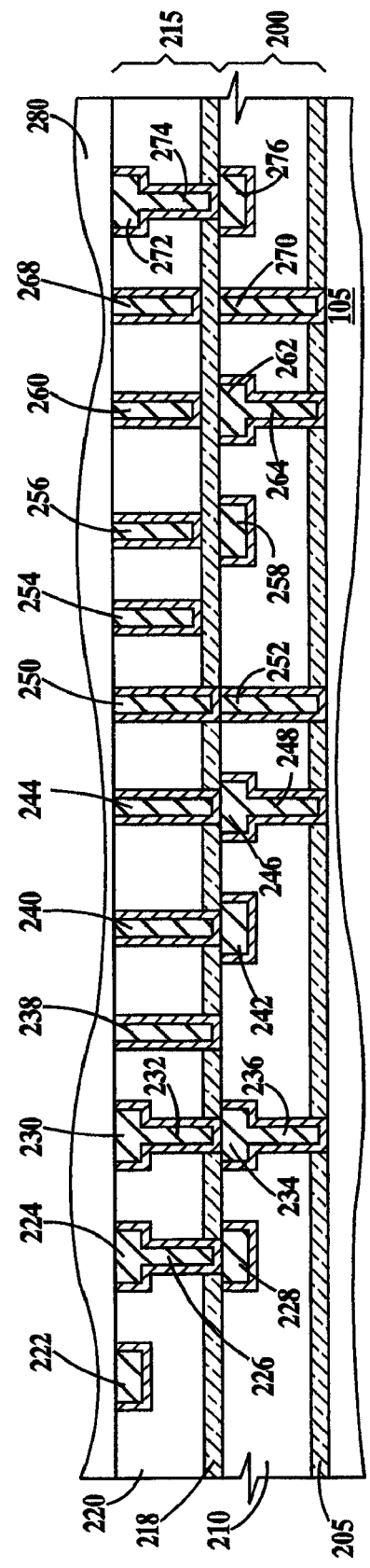
FIG. 3A
FIG. 3B

DUAL DAMASCENE WIRING AND METHOD

BACKGROUND OF INVENTION

1. Field of the Invention

The present invention relates to the field of integrated circuits; more specifically, it relates to a dual damascene wiring structure and method of fabricating the dual damascene wiring structure.

2. Background of the Invention

Dual damascene wiring, is used as a method of interconnecting semiconductor and other structures into integrated circuits because of the increased density over older interconnection methods. The industry is constantly looking for new dual damascene wiring structures that improve dual damascene wire fabrication and dual damascene wiring efficiency.

SUMMARY OF INVENTION

A first aspect of the present invention is a dual damascene structure, comprising: a first interconnect level comprising a first dielectric layer and including a multiplicity of first damascene or dual damascene conductive wires, each first damascene or dual damascene conductive wire extending from a top surface of the first dielectric layer a distance toward a bottom surface of the first dielectric layer, the distance less than, equal to greater than a thickness of the first dielectric layer; a second interconnect level directly above and in contact with the first dielectric layer, the second interconnect level comprising a second dielectric layer and including a multiplicity of second dual damascene conductive wires, each second dual damascene conductive wire extending from a top surface of the second dielectric layer a distance toward a bottom surface of the second dielectric layer, the distance less than a thickness of the second dielectric layer; and a dual damascene conductive via bar within the second interconnect level and integral with and extending from a bottom surface of one of the multiplicity of the second dual damascene conductive wires and a top surface of one of the multiplicity of the first dual damascene conductive wires, the dual damascene conductive via bar having a length greater than its width, the length and width of the dual damascene conductive via bar extending in the plane defined by the top surface of the second dielectric layer.

A second aspect of the present invention is a method of fabricating a dual damascene structure, comprising: forming a first interconnect level comprising a first dielectric layer and including a multiplicity of first damascene or dual damascene conductive wires, each first damascene or dual damascene conductive wire extending from a top surface of the first dielectric layer a distance toward a bottom surface of the first dielectric layer, the distance less than a thickness of the first dielectric layer; forming a second interconnect level directly above and in contact with the first dielectric layer, the second interconnect level comprising a second dielectric layer and including a multiplicity of second dual damascene conductive wires, each second dual damascene conductive wire extending from a top surface of the second dielectric layer a distance toward a bottom surface of the second dielectric layer, the distance less than a thickness of the second dielectric layer; and forming a dual damascene conductive via bar within the second interconnect level and integral with and extending from a bottom surface of one of the multiplicity of the second dual damascene conductive wires and a top surface of one of the multiplicity of the first dual damascene conductive wires, the dual damascene conductive via bar having a length greater than its width, the length and width of the dual damascene conductive via bar extending in the plane defined by the top surface of the second dielectric layer.

A third aspect of the present invention is a method of fabricating a dual damascene structure, comprising: (a) providing a substrate; (b) forming a dielectric layer on the top surface of the dielectric layer; (c) forming a via bar opening in the dielectric layer, the via bar opening having a length greater than its width, the length and width of the via bar opening extending in the plane defined by the top surface of and dielectric layer, the via bar opening extending through the entire thickness of the dielectric layer; (d) etching a first trench in the dielectric layer, the first trench aligned to the via bar opening, the first trench extending from the top surface of the dielectric layer toward a bottom surface of the dielectric layer a distance less than a thickness of the dielectric layer; (e) applying an anti-reflective coating to a top surface of the dielectric layer, the antireflective coating filling the via bar opening; (f) applying a masking layer to a top surface of the antireflective coating; (g) etching the antireflective coating from the via bar opening and forming a first trench in the dielectric layer over the via bar opening, the first trench extending from the top surface of the dielectric layer toward the bottom surface of the dielectric layer a distance less than a thickness of the dielectric layer; (h) removing the masking layer and any remaining antireflective coating; and (i) filling the first trench and the via bar opening with a conductor.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 1F are cross-sectional views illustrating fabrication of the damascene wiring elements is according to the present invention;

FIG. 3A is a top view and FIG. 3B is a cross-sectional view through line 3B—3B of FIG. 3A illustrating various combinations of dual damascene wires and dual damascene via bars according to the present invention;

DETAILED DESCRIPTION

A damascene process is one in which wire trench or via openings are formed in a dielectric layer, an electrical conductor deposited on a top surface of the dielectric of sufficient thickness to fill the trenches and a chemical-mechanical-polish (CMP) process performed to remove excess conductor and make the surface of the conductor co-planer with the surface of the dielectric layer to form a damascene wires (or damascene vias).

A dual damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor is deposited on a top surface of the dielectric of sufficient thickness to fill the trenches and via opening and a CMP process performed to make the surface of the conductor in the trench co-planer with the surface the dielectric layer to form dual damascene wire and dual damascene wires having integral dual damascene vias.

Figure 1A:
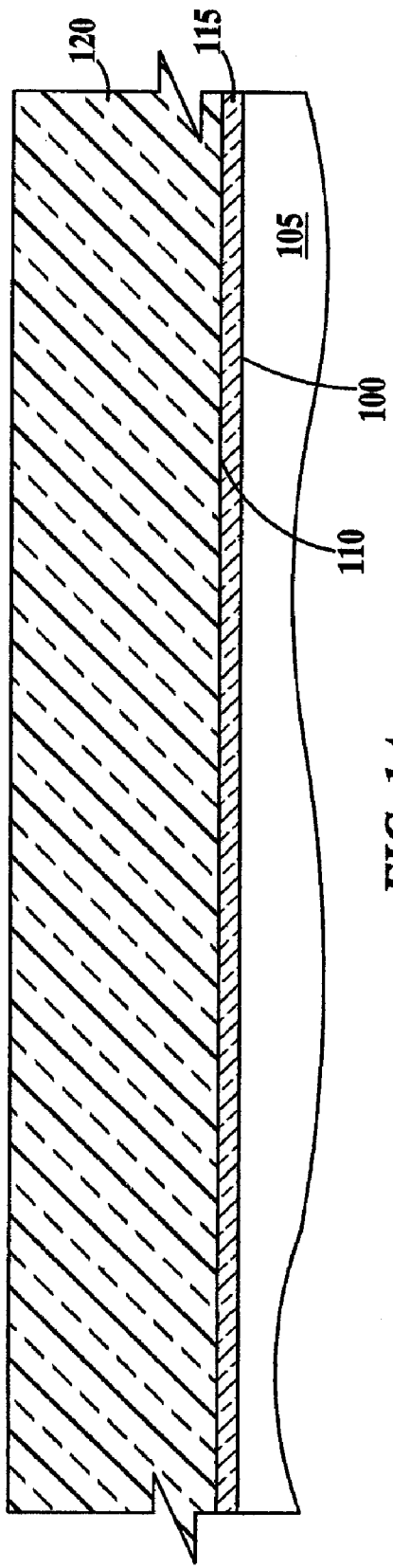

FIGS. 1A through 1F are cross-sectional views illustrating fabrication of the damascene wiring elements is according to the present invention. In FIG. 1A, formed on a top surface 100 of a substrate 105 is a dielectric diffusion barrier layer 115. Formed on a top surface 110 of dielectric diffusion barrier layer 115 is an interlevel dielectric (ILD) layer 120. ILD layer 120 may include additional layers of interlevel dielectrics and dielectric diffusion barrier layers. Substrate 105 may include integrated circuit devices such as field effect transistors (FETs), bipolar transistors including SiGe bipolar transistors, diodes, resistors, capacitors and/or inductors as well as contacts to these devices connecting them to wiring structures that will be formed in dielectric diffusion barrier layer 115 and ILD layer 120.

Examples of dielectric diffusion barrier layer 115 materials include, but are not limited to silicon nitride and silicon carbide and other dielectric materials. In ILD layer 120, examples of ILD may include, bulk or porous silicon oxide, $SiC_xO_yH_z$, SiLK™ (poly(arylene) ether) manufactured by Dow Chemical, Midland, Mich., and other dielectric materials. In one example, dielectric diffusion barrier layer 115 is SiCN or $Si_3N_4$ and is about 50 nm to about 10 mm thick and ILD layer 120 is about 200 nm to about 6 microns thick.

Figure 1B:
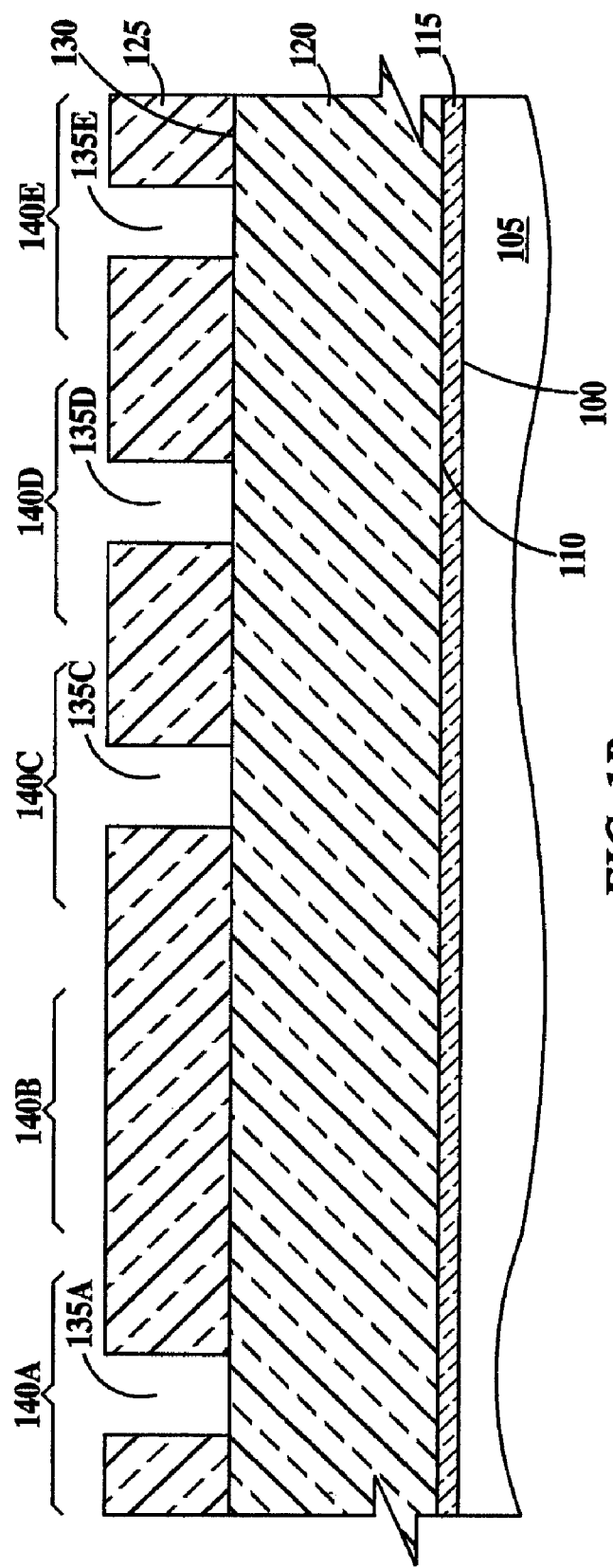

In FIG. 1B, a photoresist layer 125 is formed on a top surface 130 of ILD layer 120 and openings 135A, 135C, 135D and 135E are formed in the photoresist layer in respective regions 140A, 140C, 140D and 140E by removal of the photoresist layer in these regions. Openings 135A, 135C, 135D and 135E may be formed by any of a number of photolithographic processes well known in the art. If a bottom anti-reflective coating (BARC) is not then top surface 130 of ILD layer 130 is exposed in openings 135A, 135C, 135D and 135E. Alternatively, a BARC deposited using spin on or chemical vapor deposition (CVD) methods as known in the could be employed over top surface 130 of ILD layer 120 and under photoresist layer 125. Photoresist layer 125 is not removed in a region 140B.

Figure 1C:
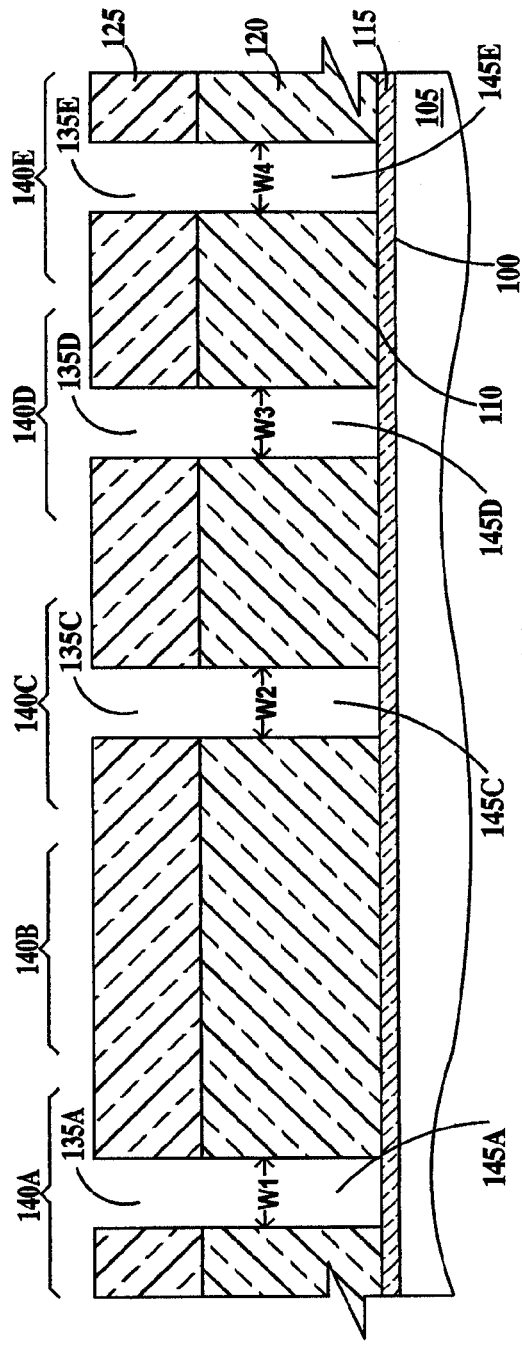

In FIG. 1C, via opening 145A, and via bar openings 145C, 145D and 145E have been formed in respective region 140A, 140C, 140D and 140E of ILD layer 120 wherever the ILD layer is not covered by photoresist layer 125 using, for example, a reactive ion etch (RIE) process selective to ILD layer 120 over dielectric diffusion barrier layer 115. Any number of suitable RIE processes that are well known in the art may be used. An etch process is to selective to a first layer over a second layer when the first layer etches at a faster rate than the second layer. Top surface 110 of dielectric diffusion barrier layer 115 is exposed in via opening 145A and via bar openings 145C, 145D and 145E. Via opening 145A has a width W1, via bar opening 145C has a width W2, via bar opening 145D has a width W3 and via bar opening 145E has a width W4. In a first example, W1=W2=W3=W4. In a second example, W1, W2, W3, and W4 are each about 140 nm. In a third example W2, W3 and W4 are each independently greater than W1.

Figure 1D:
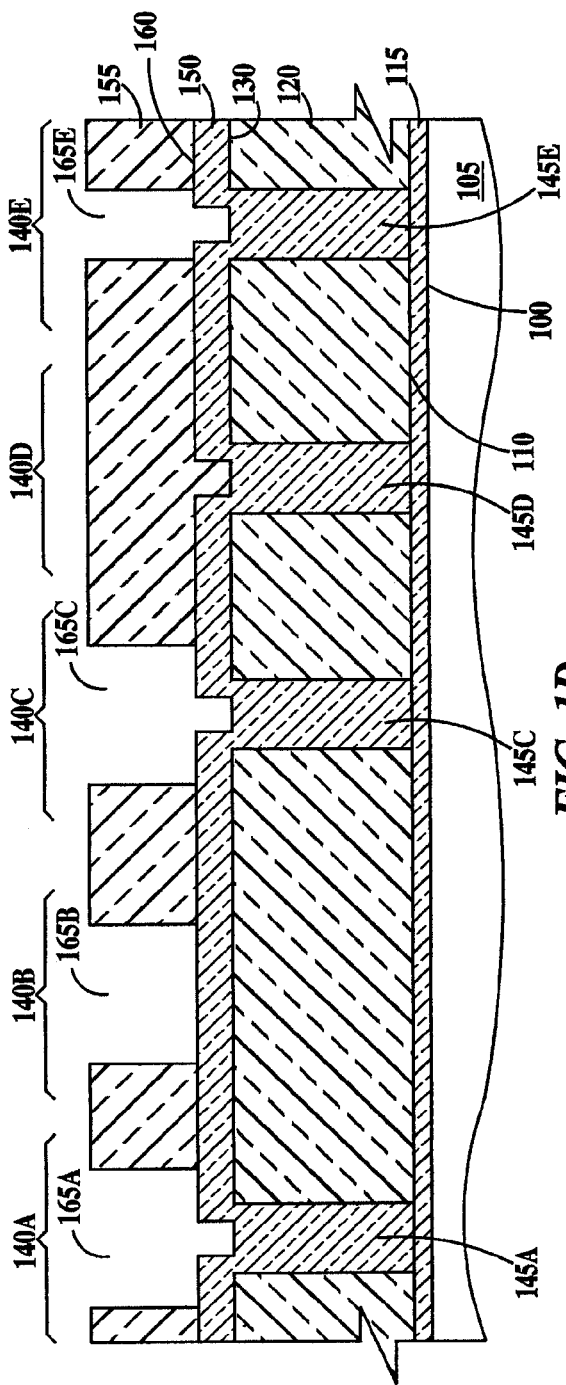

In FIG. 1D, photo resist layer 125 (see FIG. 1C) is removed. An anti-reflective coating (ARC) 150 is applied to top surface 130 of ILD layer 120 filling via opening 145A and via bar openings 145C, 145D and 145E, as known in the art. A photoresist layer 155 is applied to a top surface 160 of ARC 150 and openings 165A, 165B, 165C and 165E are formed in the photoresist layer in respective regions 140A, 140B, 140C and 140E. Openings 165A, 165B, 165C and 165E aligned to via or via bar openings in ILD layer 120 or to prior layer structures on the substrate as known in the art. Openings 165A and 165C are aligned respectively to via openings 145A and 145C in ILD layer 120 and are wider than trenches 145A and 145B. In one example ARC 150 is about 50 nm to about 800 nm thick in areas without via or via bar openings and fills the via and via bar openings void free in areas with via or via bar openings.

The presence of both via holes and via bars makes it more difficult to achieve good ARC layer 150 fill. Because the via bars have much higher volume than via holes, ARC layer 150 tends to be pulled down into the via bar, which results in increased sensitivity to etching through ARC layer 150 into or beyond dielectric layer 115 during the subsequent trough etch step. To avoid this, the fill of ARC layer 150 may need to be optimized, by increasing the shot size as part of the spin-apply process (e.g. for a 200 mm wafer using Shipley AR14 ARC, increase the shot size from 1.5 ml to 5 ml); using multi step post ARC apply bakes to enhance the reflow into the via bars; or using a two step ARC apply and cure process, where the ARC is applied and annealed twice. When the ARC fill is optimized, it is important to keep it's thickness in areas without via holes or via bars minimized (e.g. 50–200 nm) so that the trough etch process does not need to etch through excessive ARC with resulting degradation of the trench resist profiles.

In FIG. 1E, a sequential RIE process is performed to remove any ARC 150, ILD layer 120 and dielectric diffusion barrier layer 115 not protected by photoresist layer 155 (see FIG. 1D). Any number of suitable RIE processes that are well known in the art may be used. Photoresist layer 155 (see FIG. 1D) was removed as part of the etching, prior to etching diffusion barrier layer 115. In region 140A, a wire trench 170A having a depth D into ILD layer 120 and aligned over via opening 145A is formed. In region 140B, a wire trench 170B having the depth D into ILD layer 120 in region is formed. In region 140C, a wire trench 170C having the depth D into ILD layer 120 and aligned over via bar opening 145C is formed. In one example D is about 30% to about 70% of the thickness of ILD layer 120. Further dielectric diffusion barrier layer 115 is removed from the bottom of via opening 145A and via bar openings 145C and 145E. Wire trench 170A has a width W5, wire trench 170B has a width W6 and wire trench 140C has a width W7. In a first example W5=W6=W7. In a second example W5 is greater than W1. In a third example W7 is greater than W2. In a fourth example W5, W6 and W7 are between about 140 nm and about 1 mm.

Figure 2:
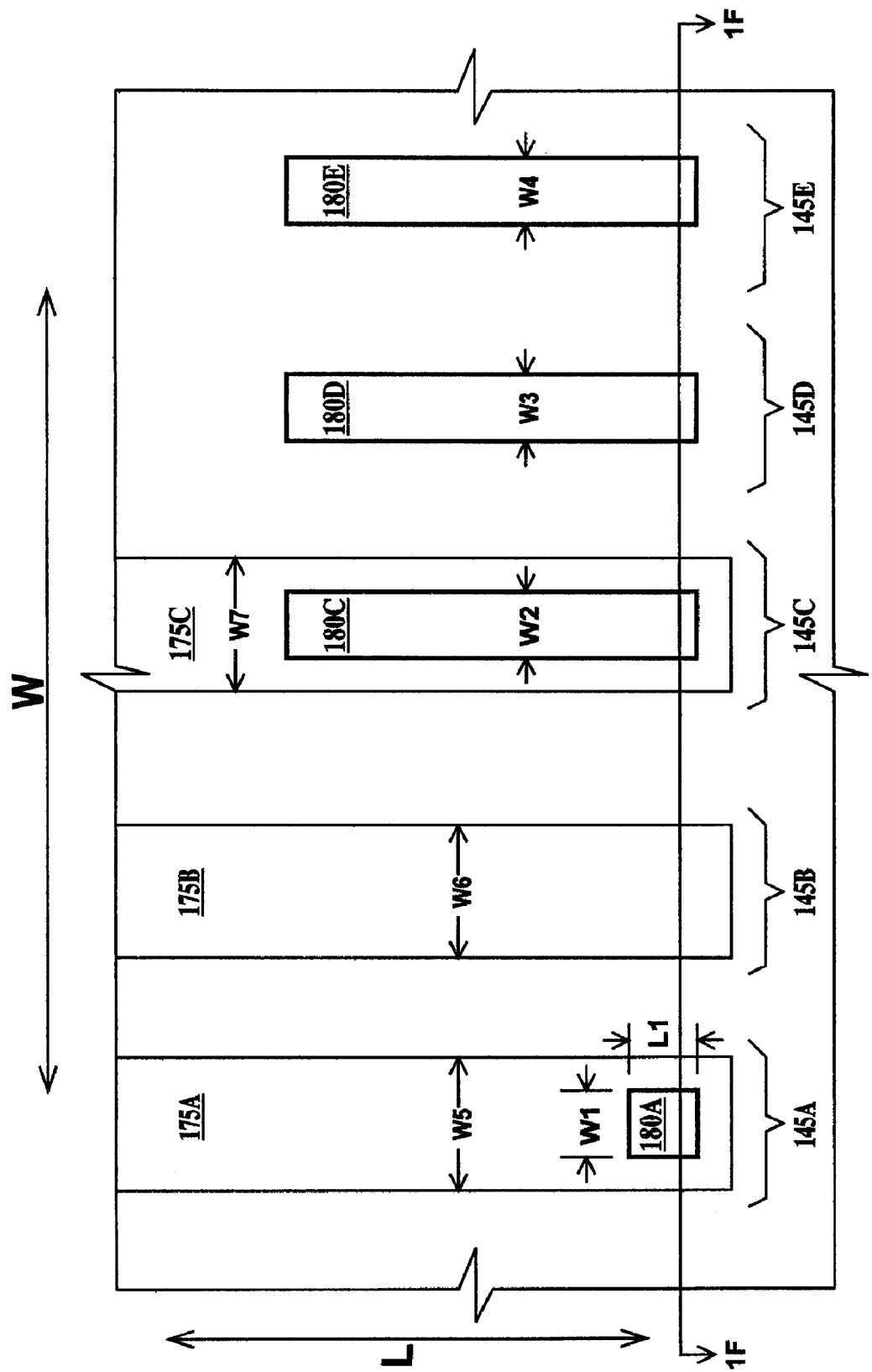
FIG. 2 is a top plan view of FIG. 1F.

FIG. 1F is a cross sectional view through line 1F—1F of FIG. 2. In FIG. 1F, in region 140A, a dual damascene wire 175A having an integral dual damascene via 180A is formed in wire trench and via 170A and opening 145A (see FIG. 1E). In region 140B, a dual damascene wire 175B is formed in wire trench 170B (see FIG. 1E). In region 140C, a dual damascene wire 175C having an integral dual damascene via bar 180C is formed in wire trench 170C and via bar opening 145D (see FIG. 1E). In region 140D, a dual damascene via bar 180D is formed in via bar opening 145D (see FIG. 1E). In region 140E, a dual damascene via bar 180E is formed in via bar opening 145E (see FIG. 1E). Dual damascene wires 175A, 175B and 175C, dual damascene via 180A, dual damascene via bars 180C, 180D and 180E each include an optional conductive liner 185 and a core conductor 190. Dual damascene wires 175A, 175B and 175C, dual damascene via 180A and dual damascene via bars 180C, 180D and 180E and have been formed by a one or more depositions of a conformal conductive material to form conductive liner 185, deposition of a conductive seed layer (in one example, the conductive seed layer is copper), electroplating or combinations thereof of a conductive material to form core conductor 190 followed by a CMP to remove all excess liner and core material from top surface 130 of ILD layer 120. Alternatively, the seed layer may be formed by a CVD process instead of an electroplating process. Examples of deposition processes include but is not limited to physical vapor deposition (PVD), ionized PVD (IPVD), self ionized plasma (SIP) deposition, hollow cathode magnetron (HCD) deposition, chemical vapor deposition (CVD) and atomic layer deposition (ALD).

The presence of both via holes and via bars makes it more difficult to achieve void free Cu fill. Because the via bars have much higher volume than via holes, and can be wider due either to design or process issues, care must be taken to avoid voids in the electroplated Cu. In particular, Cu electroplating is commonly performed in a three step process: 1) low current plating initiation step; 2) medium current plating gap fill step; 3) high current plating overburden step. Step 3), the high current plating overburden step, has poor gap fill, and the medium current plating step 2) must be performed for enough time to completely fill the via bars.

Top surfaces 195A, 195B, 195C, 195D and 195ED of respective dual damascene wires 175A, 175B and 175C and dual damascene via bars 180D and 180E are substantially co-planar with top surface 130 of ILD layer 120. One difference between dual damascene via bar 180D and dual damascene via bar 180E is dual damascene via bar 180D does not extend through dielectric diffusion barrier layer 115 while dual damascene via bar 180E does extend through dielectric diffusion barrier layer 115. One difference between dual damascene via bar 180C and dual damascene via bar 180E is dual damascene via bar 180C does not extend to top surface 130 of ILD layer 120) while dual damascene via bar 180E does extend to top surface 130 of ILD layer 120. (In a first sense dual damascene via bar 180C only extends to the bottom of dual damascene wire 175C, however since dual damascene via bar 180C is integral with dual damascene wire 175C, in a second sense dual damascene via bar 180C does extend to the top surface 130 of ILD layer 120. It is the first in the first sense the comparison between dual damascene via bar 180C and dual damascene via bar 180E is made.)

The material of conductive liner 185 may be chosen to be a diffusion barrier to the material of core conductor 190. The material of dielectric diffusion barrier layer 115 may be selected to be a dielectric diffusion barrier to the material of core conductor 190. Suitable materials for conductive liner 185 include, but are not limited to tantalum, tantalum nitride, tantalum silicon nitride, titanium, titanium nitride, titanium silicon nitride, tungsten, tungsten nitride, tungsten silicon nitride and combinations thereof. Suitable materials for core conductor 190 include, but are not limited to copper, tungsten, aluminum, aluminum-copper alloy and polysilicon.

FIG. 2 is a top plan view of FIG. 1F. In FIG. 2, dual damascene wire 175A extends in a lengthwise direction parallel to an L-axis and extends in a widthwise direction parallel to a W-axis orthogonal to the L axis the distance W5. Dual damascene via 180A extends in the L-axis direction a distance L1 and extends in the W-axis direction the distance W1. In one example, L1=W1. Dual damascene wire 175B extends in the L-axis direction an arbitrary distance and extends in the W-axis direction the distance W3. Dual damascene wire 175C extends in the L-axis direction an arbitrary distance and extends in the W-axis direction the distance W7 and dual damascene via bar 180C extends the L-axis direction an arbitrary distance and extends in the W-axis direction the distance W2. Dual damascene via bar 180D extends in the L-axis direction an arbitrary distance and extends in the W-axis direction the distance W3. Dual damascene via bar 180E extends in the L-axis direction an arbitrary distance and extends in the W-axis direction the distance W4.

Dual damascene wire 175A and integral dual damascene via 180A is an example of a first wiring structure. Dual damascene wire 175B is an example of a second wiring structure. Dual damascene wire 175C and integral dual damascene via bar 180C is an example of a third wiring structure. Dual damascene via bar 180D is an example of a fourth wiring structure and dual damascene via bar 180E is an example of a fifth wiring structure of the present invention. As will be described infra, all five of these wiring structures along with others, such as terminal pads (which may be considered a type of wire) may be connected to each other and to devices such as (FETs), bipolar transistors including SiGe bipolar transistors, diodes, resistors, capacitors and/or inductors to form integrated circuits.

In typical applications, several interconnect levels (each including dual damascene wires, dual damascene vias and dual damascene via bars formed in an ILD and optionally including a dielectric diffusion barrier layer) are stacked one on top of another. The lowest interconnect level is that interconnect level closest to the substrate and the highest interconnect level is that furthest away from the substrate.

Prior to the present invention, wires like dual damascene wire 175A could only be electrically connected to a wiring structure in an adjacent lower interconnect level through a via (for example dual damascene via 180A) and wires like dual damascene wires 175A and 175B could only be electrically connected to a wiring structure in an adjacent upper interconnect level through a via (for example dual damascene via 180A) located in the upper interconnect level. Via bars like dual damascene via bar 180C and 180E allow electrical connection of wiring structures in interconnect level separated by an intervening interconnect level containing the dual damascene via bar.

Wires carry signals or power horizontally within an interconnect level. Vias carry signals and power vertically within and between interconnect levels. Via bars carry signals or power both horizontally and vertically within an interconnect level.

FIG. 3A is a top view and FIG. 3B is a cross-sectional view through line 3B—3B of FIG. 3A illustrating various combinations of dual damascene wires and dual damascene via bars according to the present invention. In FIGS. 3A and 3B, a lower interconnect level 200 including a dielectric diffusion barrier layer 205 and an ILD layer 210 is formed on top of substrate 105. An upper interconnect level 215 including a dielectric diffusion barrier layer 218 and an ILD layer 220 is formed on top of first interconnect level 200. Dual damascene wires 222, 224, 230 and 272, dual damascene via bars 226, 232, 238, 240, 244, 250, 254, 256, 260 and 268 and dual damascene via 274 are formed in upper interconnect level 215. Dual damascene wires 228, 234, 242, 246, 258, 262 and 276 and dual damascene via bars 236, 248, 252, 262 and 270 are formed in lower interconnect level 200.

Dual damascene wire 224 is electrically connected to dual damascene wire 228 through dual damascene via bar 226. Dual damascene wire 230 is electrically connected to dual damascene wire 234 through dual damascene via bar 232 and dual damascene wire 234 is further connected to devices in substrate 105 or still lower interconnect levels in substrate 105 through dual damascene via bar 236.

Dual damascene via bar 240 is electrically to dual damascene wire 242. Dual damascene via bar 244 is electrically connected to dual damascene wire 246 and dual damascene wire 246 is further connected to devices in substrate 105 or still lower interconnect levels in substrate 105 through dual damascene via bar 248. Dual damascene via bar 250 is electrically connected to dual damascene via bar 252 and dual damascene via bar 252 is further connected to devices in substrate 105 or still lower interconnect levels in substrate 105.

Dual damascene via bar 256 runs over dual damascene wire 258, but is not electrically connected to dual damascene wire 258 because of dielectric diffusion barrier layer 218 intervening between the dual damascene via bar and the dual damascene wire. Dual damascene via bar 260 runs over dual damascene wire 262, but is not electrically connected to dual damascene wire 262 because of dielectric diffusion barrier layer 218 intervening between the dual damascene via bar and the dual damascene wire. Dual damascene wire 262 is further connected to devices in substrate 105 or still lower interconnect levels in substrate 105 through dual damascene via bar 264. Dual damascene via bar 268 runs over dual damascene via bar 270, but is not electrically connected to dual damascene via bar 270 because of dielectric diffusion barrier layer 218 intervening between the two dual damascene via bars. Dual damascene via bar 270 is further connected to devices in substrate 105 or still lower interconnect levels in substrate 105. It is possible to stack dual damascene via bars that each do not extend through corresponding dielectric diffusion barrier layers of their respective interconnect levels.

Dual damascene wire 272 is electrically connected to dual damascene wire 276 through dual damascene via 274.

Dual damascene wires 222, 224 and 230 and dual damascene via bars 238, 240, 244, 250, 254, 256, 260 and 268 may be electrically connected to additional wiring structures (including terminal pads) in an upper and adjacent interconnect level 280 using any of the connection combinations shown between wiring structures in upper and lower interconnect levels 200 and 215. Any number of interconnect levels may so be built up.

Figure 4A:
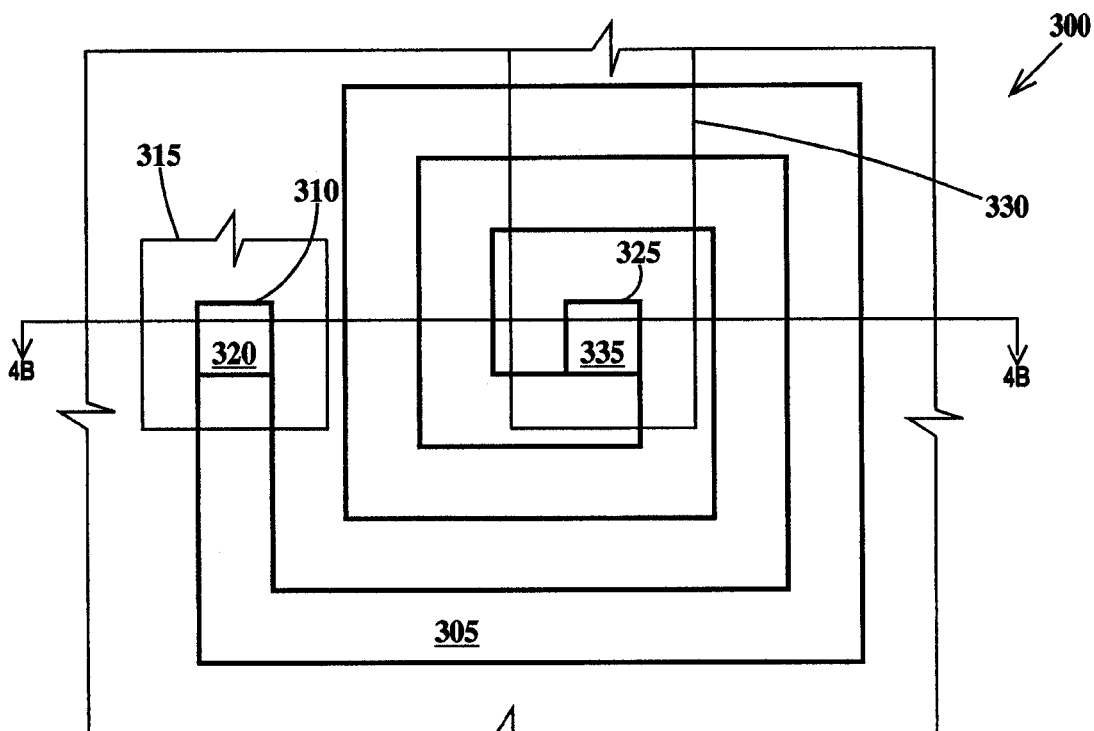
FIG. 4A is a plan view and FIG. 4B is a cross-sectional view through line 4B—4B of FIG. 4A illustrating an inductor according to the present invention.
Figure 4B:
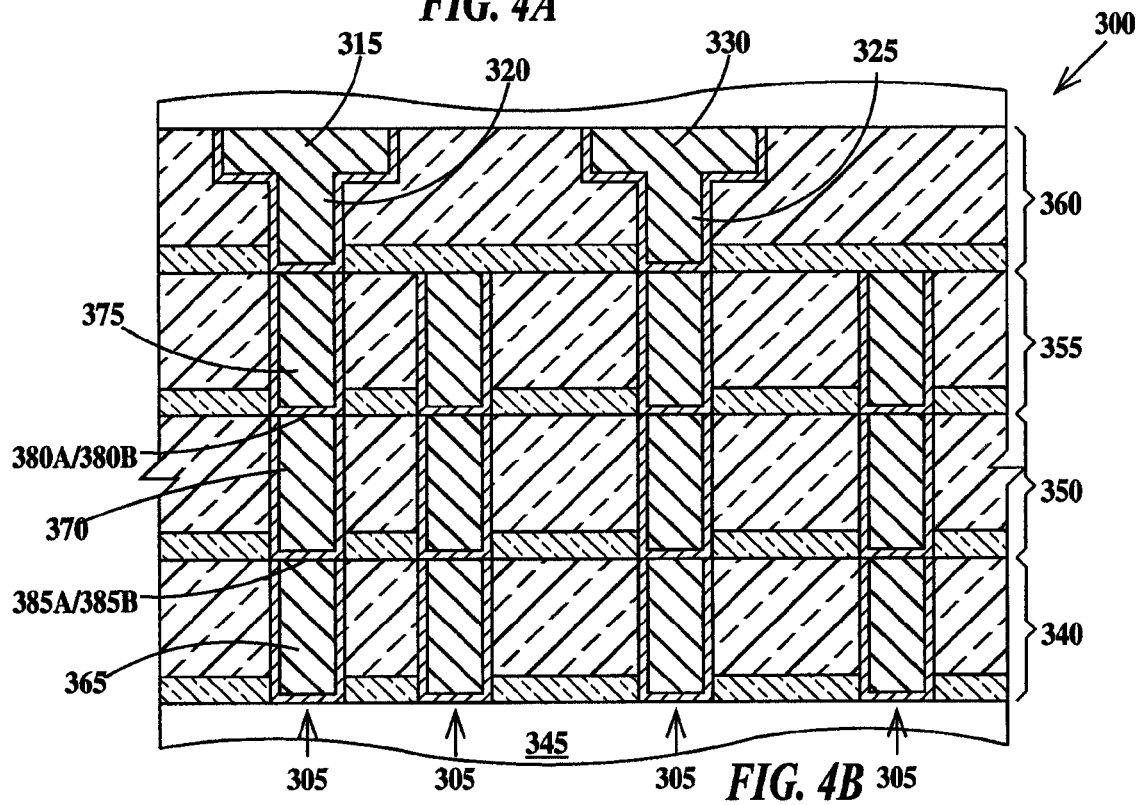

FIG. 4A is a plan view and FIG. 4B is a cross-sectional view through line 4B—4B of FIG. 4A illustrating an inductor according to the present invention. In FIG. 4A, an inductor 300 includes a stack 305 of spiral shaped conductive dual damascene via bars (see FIG. 4B). A first end 310 of stack 305 is connected to a dual damascene wire 315 by a dual damascene via 320. A second end 325 of stack 305 is connected to a dual damascene wire 330 by a dual damascene via 335.

Turning to FIG. 4B, a first interconnect level 340 is formed on top of a substrate 345. A second interconnect level 350 is formed on top of first interconnect level 340. A third interconnect level 355 is formed on top of second interconnect level 350. A fourth interconnect level 360 is formed on top of third interconnect level 355. A first spiral shaped conductive dual damascene via bar 365 is formed in first interconnect level 340. A second spiral shaped conductive dual damascene via bar 370 is formed in second interconnect level 350. A third spiral shaped conductive dual damascene via bar 375 is formed in third interconnect level 355. Dual damascene via bar 375 contacts and is electrically connected along the entire length of a bottom surface 380A of dual damascene via bar 375 to the entire length of a top surface 380B of dual damascene via bar 370. Dual damascene via bar 370 contacts and is electrically and connected along the entire length of a bottom surface 385A of dual damascene via bar 370 to the entire length of a top surface 385B of dual damascene via bar 365. While three spiral dual damascene via bars are illustrated in FIG. 4B, any number of spiral via bars in adjacent interconnect levels may be stacked to form an inductor.

While dual damascene vias 320 and dual damascene via bars 365, 370 and 375 are illustrated in FIG. 4B as having cross-sections that are narrower than, for example dual damascene wire 315, dual damascene via bars 365, 370 and 375 may be as wide as dual damascene wire 315 (with spacing adjustment to leave dielectric material between the coils of inductor 300.

Figure 5A:
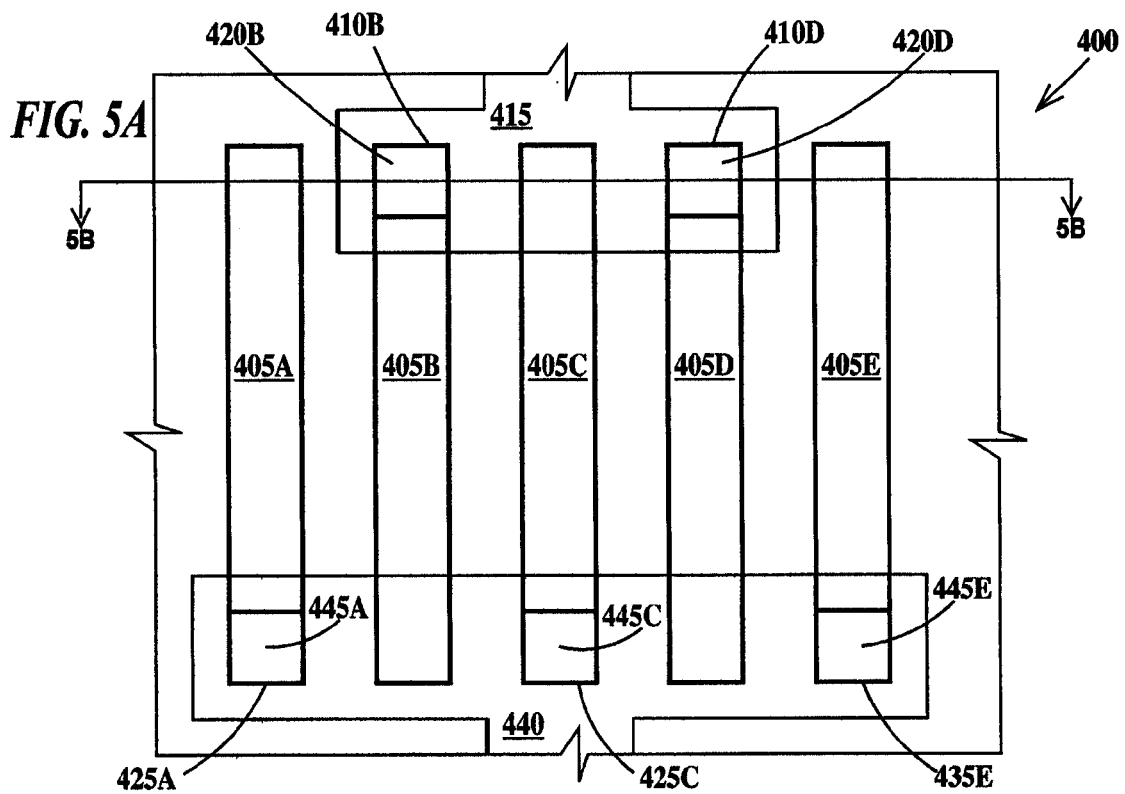
FIG. 5A is a plan view and FIG. 5B is a cross-sectional view through line 5B—5B of FIG. 5A illustrating a capacitor according to the present invention.
Figure 5B:
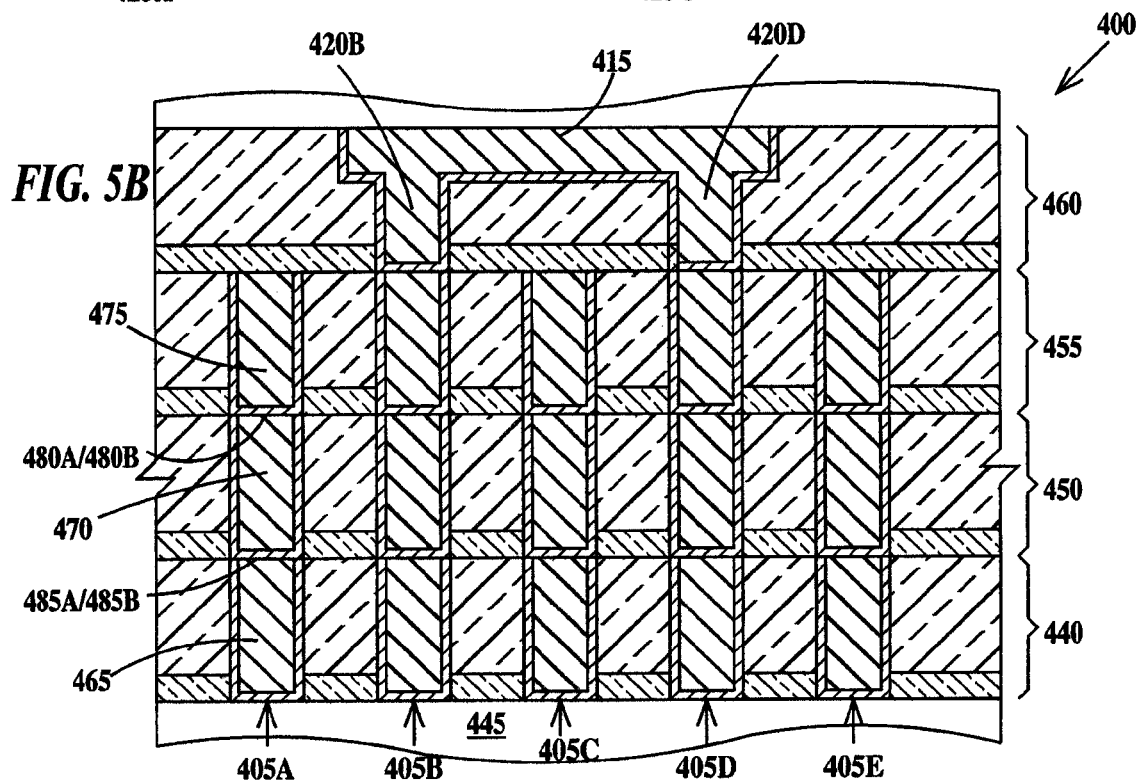

FIG. 5A is a plan view and FIG. 5B is a cross-sectional view through line 5B—5B of FIG. 5A illustrating a capacitor according to the present invention. In FIG. 5A, a capacitor 400 includes plates 405A, 405B, 405C, 405D and 405E (see also FIG. 5B). A first end 410B of plate 405B is connected to a dual damascene wire 415 by a dual damascene via 420B. A first end 410D of plate 405D is connected to dual damascene wire 415 by a dual damascene via 420D. A first end 425A of plate 405A is connected to a dual damascene wire 440 by a dual damascene via 445A. A first end 425C of plate 405C is connected to dual damascene wire 440 by a dual damascene via 445C. A first end 425E of plate 405E is connected to dual damascene wire 440 by a dual damascene via 445E.

Turning to FIG. 5B, a first interconnect level 440 is formed on top of a substrate 445. A second interconnect level 450 is formed on top of first interconnect level 440. A third interconnect level 455 is formed on top of second interconnect level 450. A fourth interconnect level 460 is formed on top of third interconnect level 455. Each plate 405A, 405B, 405C, 405D and 405E includes a dual damascene via bar 465 formed in first interconnect level 450, a dual damascene via bar 470 formed in second interconnect level 450 and a dual damascene via bar 475 formed in third interconnect level 355. Within each plate 405A, 405B 405C, 405D and 405E, corresponding dual damascene via bars 475 contact and are electrically connected along the entire length of a bottom surface 480A of dual damascene via bar 475 to the entire length of a top surface 480B of each dual damascene via bar 470. Within each plate 405A, 405B 405C, 405D and 405E, corresponding dual damascene via bars 470 contact and are electrically connected along the entire length of a bottom surface 485A of dual damascene via bar 470 to the entire length of a top surface 485B of each dual damascene via bar 465. Dual damascene via bars 475 in different plates 405A, 405B, 405C, 405D and 405E do not contact and are not electrically connected to each other. Dual damascene via bars 470 in different plates 405A, 405B, 405C, 405D and 405E do not contact and are not electrically connected to each other. Dual damascene via bars 465 in different plates 405A, 405B, 405C, 405D and 405E do not contact and are not electrically connected to each other. While three levels of dual damascene via bars are illustrated in FIG. 4B, any number of interconnect levels containing via bars may be stacked to form plates of a capacitor.

Thus the present invention provides new wiring structures that improve dual damascene wire fabrication and dual damascene wiring efficiency.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A method of fabricating a dual damascene structure, comprising:
   forming a first interconnect level comprising a first dielectric layer and including a multiplicity of first damascene or dual damascene conductive wires, each first damascene or dual damascene conductive wire extending from a top surface of said first dielectric layer a distance toward a bottom surface of said first dielectric layer, said distance less than a thickness of said first dielectric layer;
   forming a second interconnect level directly above and in contact with said first dielectric layer, said second interconnect level comprising a second dielectric layer and including a multiplicity of second dual damascene conductive wires, each second dual damascene conductive wire extending from a top surface of said second dielectric layer a distance toward a bottom surface of said second dielectric layer, said distance less than a thickness of said second dielectric layer; and
   forming a dual damascene conductive via bar within said second interconnect level and integral with and extending from a bottom surface of one of said multiplicity of said second dual damascene conductive wires and a top surface of one of said multiplicity of said first dual damascene conductive wires, said dual damascene conductive via bar having a length extending in a lengthwise direction greater than a width extending in a widthwise direction, said lengthwise direction and widthwise direction perpendicular to each other and parallel to said plane defined by said top surface of said second dielectric layer.

2. The method of claim 1, further including:
   forming a dual damascene conductive via within said second interconnect level and integral with and extending from a bottom surface of one of said multiplicity of said second dual damascene conductive wires and a top surface of one of said multiplicity of said first dual damascene conductive wires, said dual damascene conductive via having a length about equal to its width, said length and width of said dual damascene conductive via extending in a plane defined by said top surface of said second dielectric layer.

3. The method of claim 1, further including:
   forming an additional conductive dual damascene via bar within said first interconnect level, said additional conductive via bar extending from a bottom surface of one of said multiplicity of said second dual damascene conductive wires a distance toward said bottom surface of said first dielectric layer, said distance less than a distance between said additional conductive dual damascene via bar and said bottom surface of said first dielectric layer.

4. The method of claim 1, further including:
   forming an additional conductive dual damascene via bar within said first interconnect level, said additional conductive via bar extending from said top surface of said first dielectric layer a distance toward said bottom surface of said first dielectric layer, said distance less than said thickness of said first dielectric layer.

5. The method of claim 1, wherein said first dielectric layer includes a first dielectric diffusion barrier layer, a bottom surface of said first dielectric diffusion barrier layer being co-extensive with said bottom surface of said first dielectric layer and said second dielectric layer includes a second dielectric diffusion barrier layer, a bottom surface of said second dielectric diffusion barrier layer being co-extensive with said bottom surface of said second dielectric layer.

6. The method of claim 5, wherein said dielectric diffusion barrier is selected from the group consisting of silicon nitride and silicon carbide.

7. The method of claim 1, further including:
   (a) forming a spiral shaped dual damascene conductive via bar in said first dielectric layer,
   (b) forming a spiral shaped dual damascene conductive via bar in said second dielectric layer; or
   (c) forming spiral shaped dual damascene conductive via bars in both said first and said second dielectric layers, top edges of said spiral shaped dual damascene conductive via bars co-planer with top surfaces of corresponding dielectric layers and bottoms edged of said spiral shaped dual damascene conductive via bars co-planer with bottom surfaces of said corresponding dielectric layers and sidewalls of said spiral shaped dual damascene conductive via bars aligned to one another and stacked in electrical contact on top of one another.

8. The method of claim 1, further including:
   forming one or more additional interconnect levels, each additional interconnect level including a spiral shaped dual damascene conductive via bar, a top edge of each spiral shaped dual damascene conductive via bars co-planer with a top surface of its corresponding interconnect level and a bottom edge of each spiral shaped dual damascene conductive via bars co-planer with a bottom surface of its corresponding interconnect level, sidewalls of said spiral shaped dual damascene conductive via bars and sidewalls aligned to one another and stacked in electrical contact on top of one another.

9. The method of claim 1, further including:
   (a) forming a first plate of a capacitor comprising first additional dual damascene conductive via bars and a second plate of said capacitor comprising second additional dual damascene conductive via bars in said second dielectric layer; or
   (b) forming a first plate of a capacitor comprising first additional dual damascene conductive via bars comprising first additional dual damascene conductive via bars in both said first and said second dielectric layers, top edges of said first additional dual damascene conductive via bars co-planer with top surfaces of corresponding dielectric layers and bottoms edged of said first additional dual damascene conductive via bars co-planer with bottom surfaces of said corresponding dielectric layers and sidewalls of said first additional dual damascene conductive via bars aligned to one another and stacked in electrical contact on top of one another and a second plate of said capacitor comprising second additional dual damascene conductive via bars comprising second additional dual damascene conductive via bars in both said first and said second dielectric layers, top edges of said second additional dual damascene conductive via bars co-planer with top surfaces of corresponding dielectric layers and bottoms edged of said second additional dual damascene conductive via bars co-planer with bottom surfaces of said corresponding dielectric layers and sidewalls of said second additional dual damascene conductive via bars aligned to one another and stacked in electrical contact on top of one another.

10. The method of claim 1, further including:

forming a first plate of a capacitor comprising first additional dual damascene conductive via bars in additional dielectric layers, sidewalls of said first additional dual damascene conductive via bars aligned to one another and stacked in electrical contact on top of one another; and forming a second plate of a capacitor comprising second additional dual damascene conductive via bars in said additional dielectric layers, sidewalls of said second additional dual damascene conductive via bars aligned to one another and stacked in electrical contact on top of one another.

11. The method of claim 1, wherein said dual damascene conductive wires and said dual damascene conductive via and said dual damascene via bar comprise a same conductor selected from the group consisting of copper, tungsten, aluminum, aluminum-copper alloy, polysilicon, tantalum, tantalum nitride, tantalum silicon nitride, titanium, titanium nitride, titanium silicon nitride, tungsten, tungsten nitride, tungsten silicon nitride and combinations thereof.

12. The method of claim 1, wherein said dielectric layer is selected from the group consisting of silicon oxide, $SiC_xO_yH_z$ and poly(arylene) ether.

13. A method of fabricating a dual damascene structure, comprising:

(a) providing a substrate;

(b) forming a dielectric layer on said top surface of said dielectric layer;

(c) forming a via bar opening in said dielectric layer, said via bar opening having a length greater than its width, said length and width of said via bar opening extending in said plane defined by said top surface of and dielectric layer, said via bar opening extending through the entire thickness of said dielectric layer;

(d) etching a first trench in said dielectric layer, said first trench aligned to said via bar opening, said first trench extending from said top surface of said dielectric layer toward a bottom surface of said dielectric layer a distance less than a thickness of said dielectric layer;

(e) applying an anti-reflective coating to a top surface of said dielectric layer, said antireflective coating filling said via bar opening;

(f) applying a masking layer to a top surface of said anti-reflective coating;

(g) etching said antireflective coating from said via bar opening and forming a first trench in said dielectric layer over said via bar opening, said first trench extending from said top surface of said dielectric layer toward said bottom surface of said dielectric layer a distance less than a thickness of said dielectric layer;

(h) removing said masking layer and any remaining antireflective coating; and (i) filling said first trench and said via bar opening with a conductor.

14. The method of claim 13, step (c) further including: forming a via opening, said via opening having a length about equal to its width, said length and width of said visa opening extending in a plane defined by said top surface of and dielectric layer, said via opening extending through the entire thickness of said dielectric layer;

step (d) further including: etching a second trench, and said second trench aligned to said via bar opening, said second trench extending from said top surface of said dielectric layer toward a bottom surface of said dielectric layer a distance less than a thickness of said dielectric layer;

step (e) further including: filling said via opening with said antireflective coating;

step (g) further including: etching said antireflective coating from said via bar opening and forming a second trench in said dielectric layer over said via bar opening, said second trench extending from said top surface of said dielectric layer toward said bottom surface of said dielectric layer a distance less than a thickness of said dielectric layer; and step (i) further including: filling said second trench and said via bar opening with said conductor.

15. The method of claim 14, further including:

forming a dielectric diffusion barrier layer between a top surface of said substrate and in contact with a bottom surface of said dielectric layer; and etching said via opening and said via bar opening through said dielectric diffusion barrier layer in step (g).

16. The method of claim 15, wherein said dielectric diffusion barrier is selected from the group consisting of silicon nitride and silicon carbide.

17. The method of claim 13, further including:

etching an additional via bar opening in said dielectric layer in step (c);

filling said additional via bar opening with said anti-reflective coating in step (e);

not etching said third trench through said dielectric diffusion barrier layer in step (g); and filling said additional via bar opening with said conductor in step (i).

18. The method of claim 13, wherein said conductor is selected from the group consisting of copper, tungsten, aluminum, aluminum-copper alloy, polysilicon, tantalum, tantalum nitride, tantalum silicon nitride, titanium, titanium nitride, titanium silicon nitride, tungsten, tungsten nitride, tungsten silicon nitride and combinations thereof.

19. The method of claim 13, wherein said anti-reflective coating has a thickness of between about 400 nm to about 800 nm.

20. The method of claim 13, wherein said dielectric material is selected from the group consisting of silicon oxide, $SiC_xO_yH_z$ and poly(arylene) ether.

* * * * *